(12) United States Patent
Tanaka et al.

(10) Patent No.: US 10,685,976 B2
(45) Date of Patent: Jun. 16, 2020

(54) SEMICONDUCTOR MEMORY DEVICE (71) Applicant: Toshiba Memory Corporation, Minato-ku (JP)

(72) Inventors: Hiroyasu Tanaka, Yokkaichi (JP); Tomoaki Shino, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/178,336

(22) Filed: Nov. 1, 2018

(65) Prior Publication Data

US 2019/0074293 A1 Mar. 7, 2019

Related U.S. Application Data (63) Continuation of application No. 15/462,424, filed on Mar. 17, 2017, now Pat. No. 10,134,755.

(60) Provisional application No. 62/395,742, filed on Sep. 16, 2016.

(51) Int. Cl.
*H01L 27/11582* (2017.01)
*H01L 27/11573* (2017.01)
*H01L 27/11526* (2017.01)

(52) U.S. Cl.
CPC .. *H01L 27/11582* (2013.01); *H01L 27/11526* (2013.01); *H01L 27/11573* (2013.01)

(58) Field of Classification Search
CPC ......... H01L 27/11582; H01L 27/11526; H01L 27/11573
USPC ...................................................... 257/314
See application file for complete search history.

(56) References Cited

U.S. PATENT DOCUMENTS

| 2002/0113317 | A1* | 8/2002 | Okushima | H01L 21/76801 257/774 |
|---|---|---|---|---|
| 2004/0094793 | A1 | 5/2004 | Noguchi et al. | |
| 2007/0063266 | A1 | 3/2007 | Natori et al. | |
| 2008/0186771 | A1 | 8/2008 | Katsumata et al. | |
| 2009/0230462 | A1 | 9/2009 | Tanaka et al. | |
| 2014/0061750 | A1* | 3/2014 | Kwon | H01L 27/1052 257/314 |
| 2014/0374811 | A1 | 12/2014 | Larsen et al. | |
| 2015/0014622 | A1 | 1/2015 | Kanno et al. | |
| 2015/0255478 | A1* | 9/2015 | Tanzawa | H01L 27/11556 257/314 |

(Continued)

FOREIGN PATENT DOCUMENTS

JP    2008-192708    8/2008

*Primary Examiner* — Walter H Swanson
(74) *Attorney, Agent, or Firm* — Oblon, McClelland, Maier & Neustadt, L.L.P.

(57) ABSTRACT

A semiconductor memory device includes a memory plane including a plurality of electrode layers stacked on a substrate and a semiconductor layer extending through the plurality of electrode layers in a stacking direction thereof, a circuit provided on the substrate around the memory plane, a first insulating layer covering the circuit, and a second insulating layer including a first portion and a second portion between the substrate and the first insulating layer. The first portion is provided along an outer edge of the memory plane, and the second portion is spaced from the first portion and is provided on the circuit side. The first insulating layer includes a part in contact with the substrate between the first portion and the second portion, and the first insulating layer blocks a diffusion of hydrogen radicals with a higher rate than the second insulating layer.

17 Claims, 10 Drawing Sheets (56) References Cited

U.S. PATENT DOCUMENTS

| | | | |
|---|---|---|---|
| 2016/0071877 A1* | 3/2016 | Kim | H01L 27/11582 257/314 |
| 2016/0118399 A1* | 4/2016 | Son | G11C 5/025 365/185.18 |
| 2017/0236835 A1 | 8/2017 | Nakamura et al. | |

* cited by examiner

SEMICONDUCTOR MEMORY DEVICE

CROSS-REFERENCE TO RELATED APPLICATIONS

This application is a continuation application of U.S. patent application Ser. No. 15/462,424, filed on Mar. 17, 2017, which claims the benefit of priority from U.S. Provisional Patent Application 62/395,742 filed on Sep. 16, 2016; the entire contents of which are incorporated herein by reference.

FIELD

Embodiments are generally related to a semiconductor memory device.

BACKGROUND

A semiconductor memory device is under developing, which includes three-dimensionally arranged memory cells. For example, a NAND type memory device includes a plurality of word lines stacked on a substrate and a semiconductor layer extending through the word lines in a stacking direction. A memory cell is provided at a portion where the semiconductor layer intersects each word line, and is driven by a peripheral circuit electrically connected to the word line and the semiconductor layer. In such a memory device, a memory cell array including three-dimensionally arranged memory cells is formed after the peripheral circuit is formed on a substrate. Thus, there may be a case where the peripheral circuit is damaged in the forming process of the memory cell array.

BRIEF DESCRIPTION OF THE DRAWINGS

FIGS. 3A to 3F are schematic cross-sectional views showing a manufacturing process of the semiconductor memory device according to the embodiment;

FIGS. 7A to 7E are schematic views showing layouts of the semiconductor memory device according to the embodiment.

DETAILED DESCRIPTION

According to one embodiment, a semiconductor memory device includes a memory plane including a plurality of electrode layers stacked on a substrate and a semiconductor layer extending through the plurality of electrode layers in a stacking direction thereof, a circuit provided on the substrate around the memory plane, a first insulating layer including a first portion and a second portion between the substrate and a second insulating layer, and the second insulating layer covering the circuit. The first portion is provided along an outer edge of the memory plane, and the second portion is spaced from the first portion and is provided on the circuit side. The second insulating layer includes a part in contact with the substrate between the first portion and the second portion, and the second insulating layer blocks a diffusion of hydrogen radicals with a higher rate than the first insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
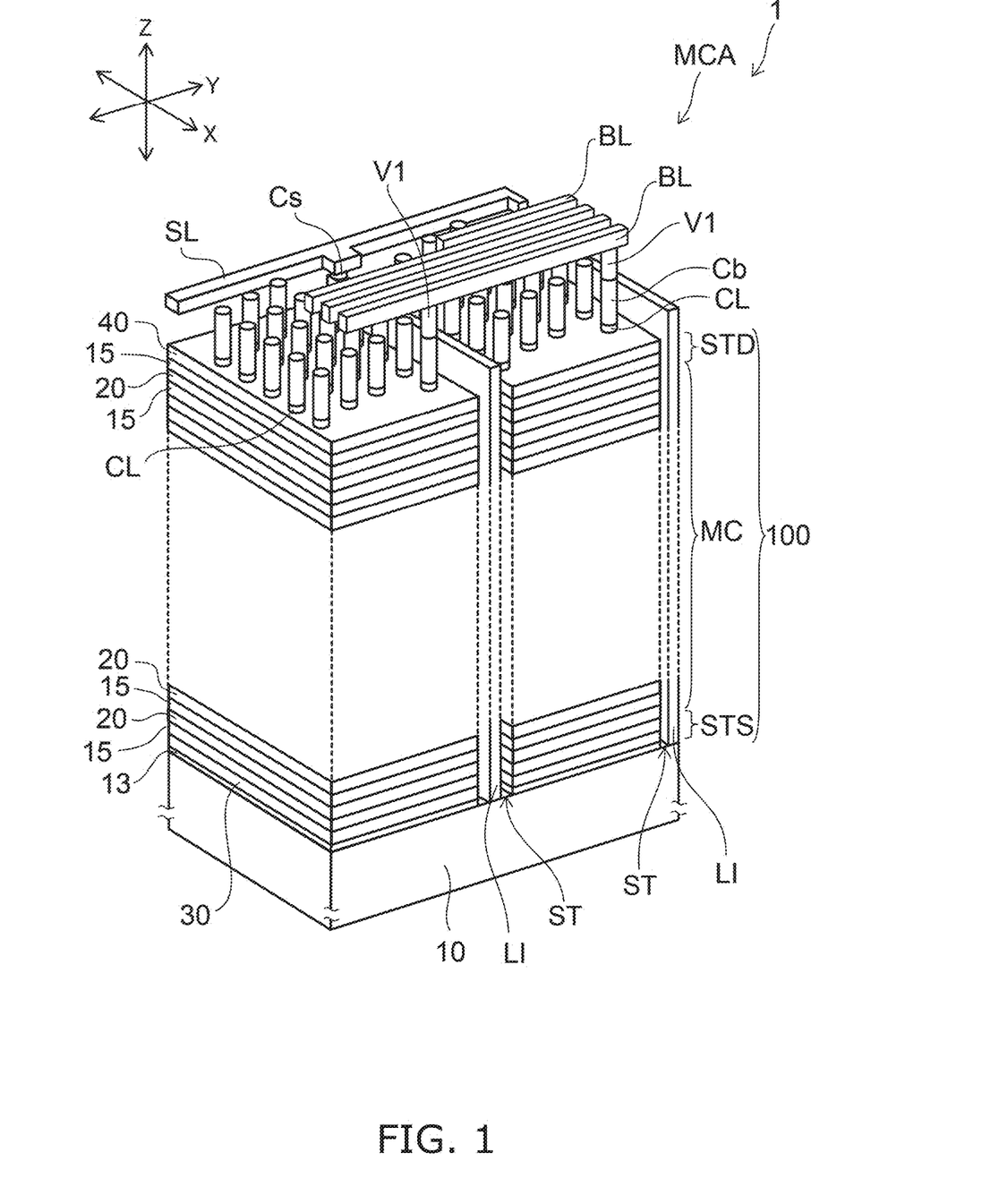
FIG. 1 is a perspective view schematically showing a semiconductor memory device according to an embodiment.

FIG. 1 is a perspective view schematically showing a memory cell array MCA of a semiconductor memory device 1 according to an embodiment. The semiconductor memory device 1 is, for example, a NAND type memory device and includes three-dimensionally arranged memory cells MC.

As shown in FIG. 1, the semiconductor memory device 1 includes a source layer 10 provided on a substrate 5 (see FIG. 2A) and a stacked body 100. The stacked body 100 includes a plurality of electrode layers (hereinafter, word lines 20, selection gates 30 and 40) stacked in the Z direction. On the source layer 10, a plurality of stacked bodies 100 are arranged, for example, in the Y direction. The adjacent stacked bodies 100 in the Y direction are separated from each other by a slit space SL.

The selection gate 30 is provided on the source layer 10 with an insulating layer 13 interposed. The word lines 20 are stacked on the selection gate 30. An insulating layer 15 is provided between the selection gate 30 and the lowermost layer of the word lines 20 and between the adjacent word lines 20 in the Z direction. The selection gate 40 is provided on the uppermost layer of the word lines 20 via another insulating layer 15.

The source layer 10 is, for example, a P-type well provided in the substrate 5. The word lines 20 and the selection gates 30 and 40 are, for example, metal layers or low resistance polycrystalline silicon layers. The insulating layers 13 and 15 are, for example, silicon oxide layers.

The stacked body 100 includes, for example, a plurality of columnar bodies CL extending in the Z direction through the word lines 20, the selection gates 30 and 40. Each columnar body CL includes a semiconductor layer 50 (see FIG. 2A).

The memory cell array MCA includes a plurality of stacked bodies 100 and includes a plurality of memory cells MC and selection transistors STS and STD disposed along the columnar body CL. The memory cells MC are provided at portions where the columnar body CL intersects the word lines 20. The selection transistor STS is provided at a portion where the columnar portion CL intersects the selection gate 30, and the selection transistor STD is provided at a portion where the columnar body CL intersects the selection gate 40.

The semiconductor memory device 1 further includes bit lines BL and a source line SL. The bit lines BL and the source line SL extend, for example, in the Y direction above the stacked body 100. The bit lines BL are electrically connected to the semiconductor layers 50 in the columnar bodies CL via contact plugs Cb and V1. The source line SL is electrically connected to the source layer 10 via the conductive bodies LI, for example. The conductive bodies LI are provided with a plate shape extending in the X direction and the Z direction in the slit spaces SL, for example, and are electrically connected to the source line SL via contact plugs Cs.

The semiconductor memory device 1 includes a memory plane MPL which includes at least one memory cell array MCA and a peripheral circuit PC1 provided around the memory plane MPL (see FIGS. 7A to 7E). Hereinafter, the configuration of the semiconductor memory device 1 will be described with reference to the memory plane MPL and the peripheral circuit PC1.

Figure 2A:
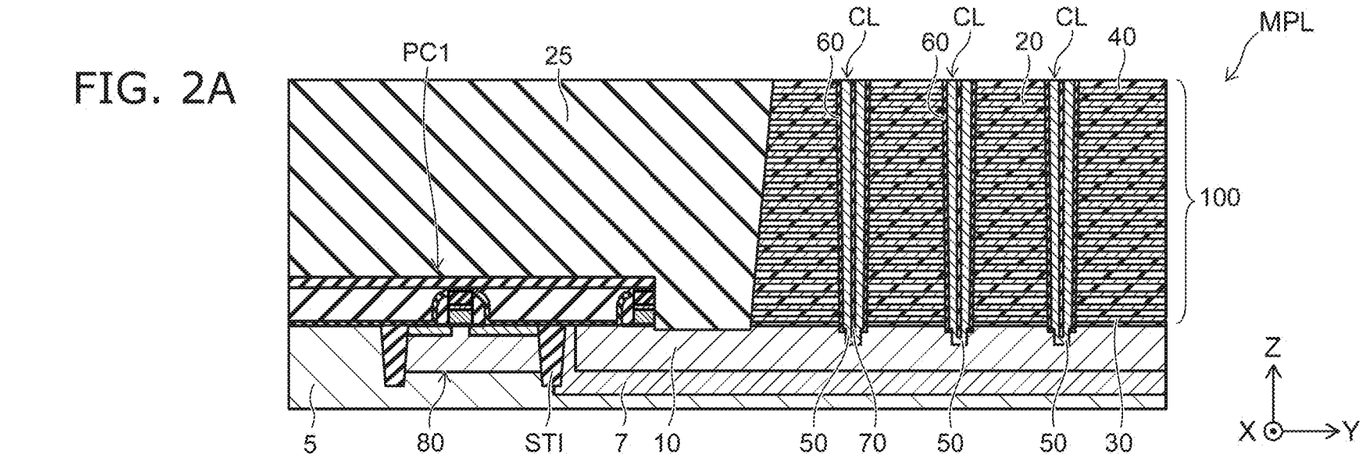
FIGS. 2A and 2B are schematic cross-sectional views showing the semiconductor memory device according to the embodiment.
Figure 2B:
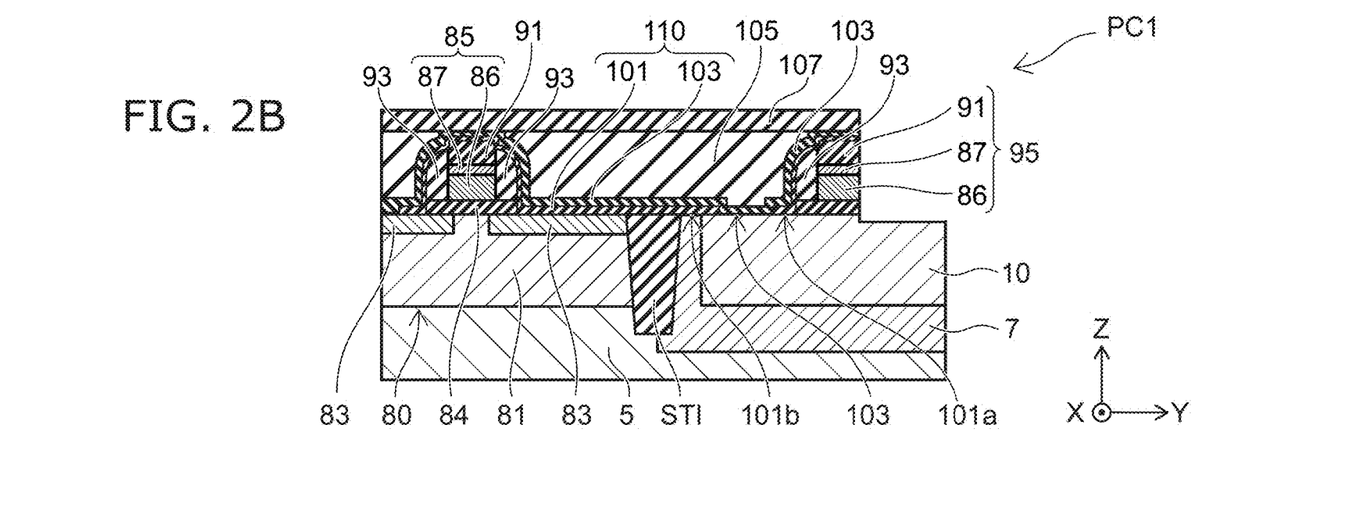

FIGS. 2A and 2B are schematic cross-sectional views showing a semiconductor memory device 1 according to the embodiment. FIG. 2A is a cross-sectional view showing a part of the memory plane MPL and a part of the peripheral circuit PC1. FIG. 2B is a cross-sectional view showing the part of the peripheral circuit PC1. The peripheral circuit PC1 includes, for example, a drive circuit such as a sense amplifier and a row decoder.

As shown in FIG. 2A, an N-type well 7 and the source layer 10 are provided on a top surface side of the substrate 5. The substrate 5 is, for example, a silicon substrate. In this example, the source layer 10 is a P-type well provided in the N-type well.

The memory plane MPL includes a plurality of stacked bodies 100 provided on the source layer 10. A columnar body CL provided in each stacked body extends from the top surface thereof to the source layer 10 through the word lines 20, the select gates 30 and 40. The columnar body CL includes a semiconductor layer 50, a memory layer 60 and a core 70. The core 70 is an insulating body extending in the Z direction, and the semiconductor layer 50 and the memory layer 60 extend in the Z direction along the core 70. The memory layer 60 is positioned between the semiconductor layer 50 and the stacked body 100. Further, the memory layer 60 includes charge storing portions positioned between the word lines 20 and the semiconductor layer 50.

An insulating layer 25 covering the peripheral circuit PC1 is provided around the memory plane MPL. The insulating layer 25 is provided so as to planarize a step difference between the stacked body 100 and the substrate 5. The insulating layer 25 is, for example, a silicon oxide layer. The peripheral circuit PC1 is provided on a top surface of the substrate 5 and is electrically insulated from the N-type well and the source layer 10 by STI (Shallow Trench Isolation), for example. FIG. 2A shows an example of one transistor 80 included in the peripheral circuit PC1.

As shown in FIG. 2B, the transistor 80 has a channel body 81 and a gate electrode 85. The channel body 81 includes two source/drain regions 83 spaced from each other, and the gate electrode 85 is provided on the channel region between the two source/drain regions 83. A gate insulating layer 84 is provided between the channel body 81 and the gate electrode 85. The gate insulating layer 84 is, for example, a silicon oxide layer.

The gate electrode 85 includes, for example, a polycrystalline silicon layer 86 and a tungsten layer 87. A barrier region (not shown) is interposed between the polycrystalline silicon layer 86 and the tungsten layer 87. The barrier region includes, for example, tungsten nitride, and suppresses migration of tungsten atoms into the polycrystalline silicon layer 86.

A cap layer 91 is provided on the gate electrode 85, and a sidewall 93 is formed on a lateral surface of the gate electrode 85. The cap layer 91 is, for example, a silicon nitride layer, and the sidewall 93 includes, for example, silicon oxide.

Moreover, a liner layer 110 is provided so as to cover the gate electrode 85, the cap layer 91 and the sidewall 93. The liner layer 110 includes a first insulating layer 101 and a second insulating layer 103. The first insulating layer 101 is, for example, a silicon oxide layer, and the second insulating layer 103 is, for example, a silicon nitride layer.

The liner layer 110 extends to the source layer 10 from a region where the peripheral circuit PC1 is provided. Then, as shown in FIG. 2B, the first insulating layer 101 is divided into a first portion 101a and a second portion 101b on the source layer 10. The first portion 101a locates on the memory plane MPL side, and the second portion 101b locates on the peripheral circuit PC1 side. The second insulating layer 103 is in contact with the source layer 10 between the first portion 101a and the second portion 101b.

Insulating layers 105 and 107 are provided on the liner layer 110. The insulating layer 105 is provided so as to planarize the step between the substrate 5 and the gate electrode 85, for example, between the gate electrode 85 and another gate electrode (not shown). Further, the insulating layer 107 is provided so as to cover the insulating layer 105 and the gate electrode 85. The insulating layer 105 is, for example, a silicon oxide layer, and the insulating layer 107 is, for example, a silicon nitride layer.

The insulating layer 105 covers, for example, a peripheral circuit region in which the peripheral circuit PC1 is provided. As shown in FIG. 2B, a dummy gate 95 is provided at the end of the peripheral circuit region on the memory plane MPL side. The dummy gate 95 includes, for example, a structure in which a polycrystalline silicon layer 86, a tungsten layer 87 and a cap layer 91 are stacked. A side wall 93 is provided on the lateral surface of the dummy gate 95 on the peripheral circuit PC1 side. The liner layer 110 covers the peripheral circuit PC1 side of the dummy gate 95. Further, a gate insulating layer 84 is provided between the source layer 10 and the dummy gate 95.

A manufacturing method of the semiconductor memory device 1 will be described below with reference to FIGS. 3A to 3F. FIGS. 3A to 3F are schematic cross-sectional views showing a manufacturing process of the semiconductor memory device 1.

Figure 3A:
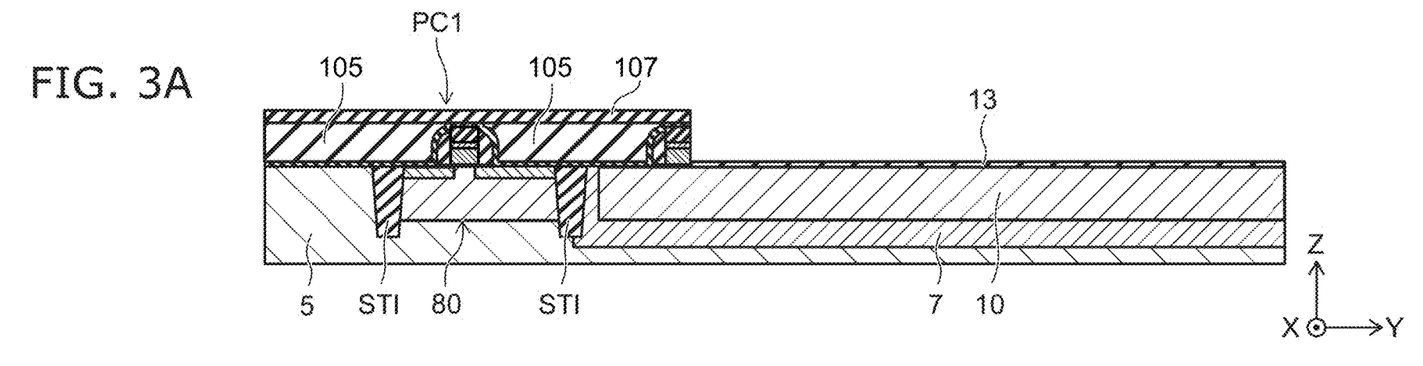

As shown in FIG. 3A, the N-type well 7 and the source layer 10 are formed on the top surface side of the substrate 5. Further, a peripheral circuit PC1 is formed around the N-type well. An insulating layer 13 is formed on the source layer 10. The insulating layer 13 is formed with the gate insulating layer 84, for example.

Figure 3B:
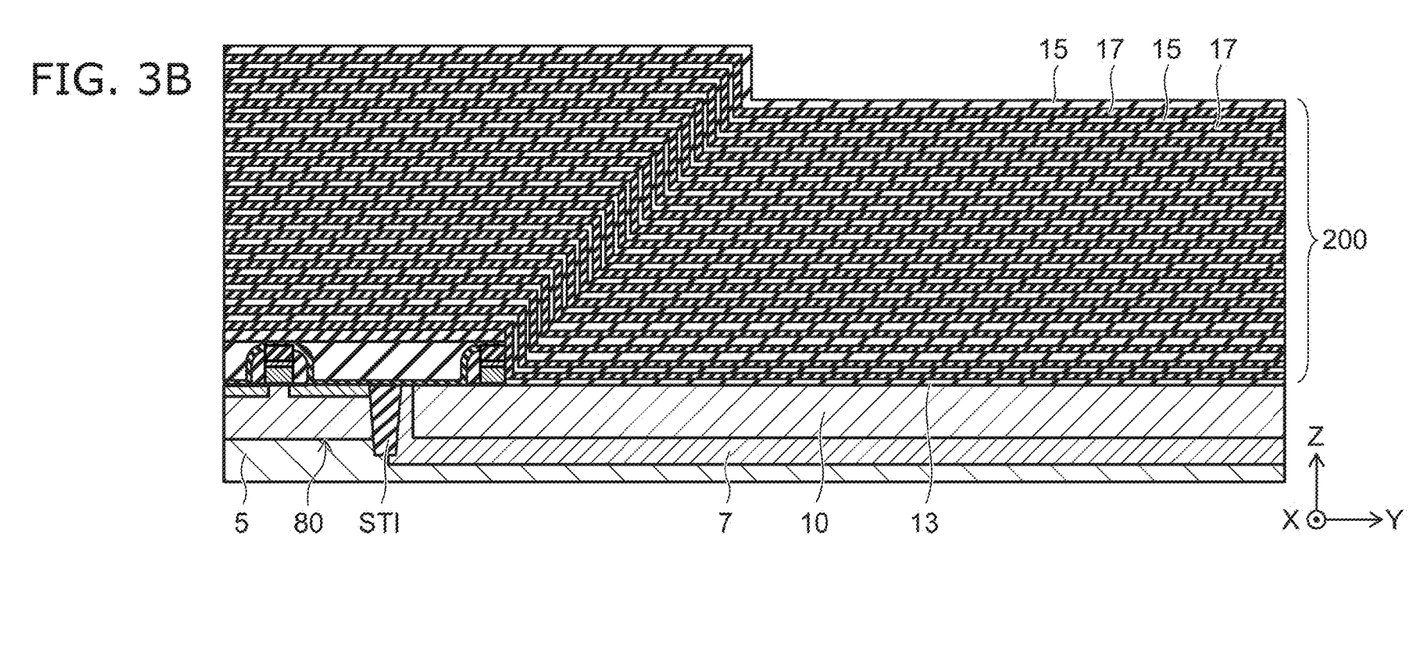

As shown in FIG. 3B, a stacked body 200 is formed to cover the source layer 10 and the peripheral circuit PC1. The stacked body 200 includes insulating layers 15 and 17. The insulating layers 15 and 17 are alternately stacked on the insulating layer 13 and the peripheral circuit PC1. The insulating layers 15 are, for example, silicon oxide layers, and the insulating layers 17 are, for example, silicon nitride layers. The insulating layers 15 and 17 are formed, for example, using PCVD (Plasma-enhanced Chemical Vapor Deposition).

Figure 3C:
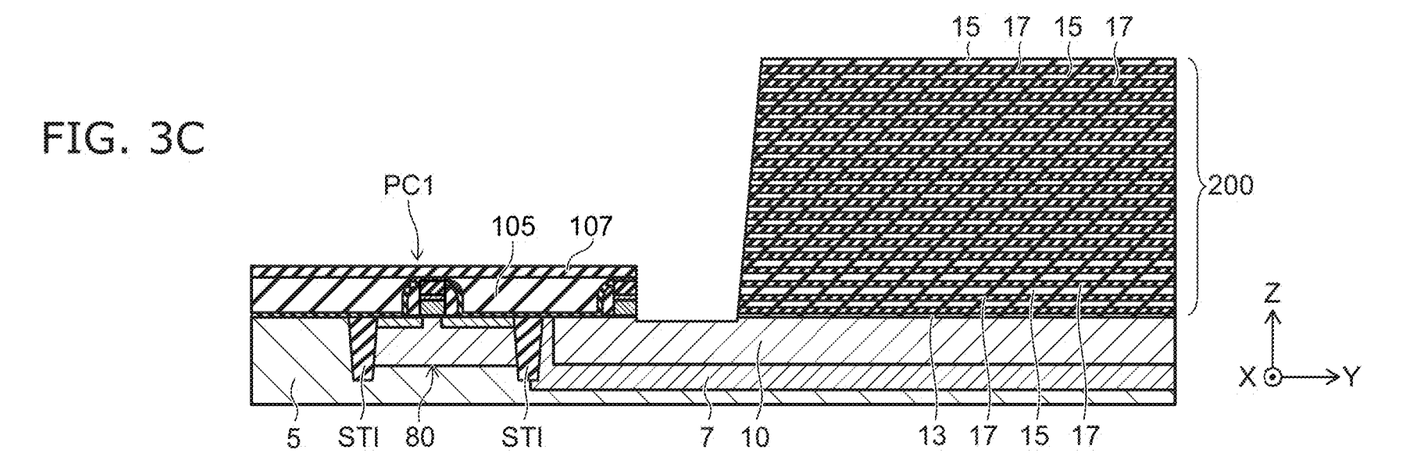

As shown in FIG. 3C, a part of the stacked body 200 is selectively removed, which covers the peripheral circuit PC1. The stacked body 200 is selectively etched, for example, using RIE. The insulating layer 107 protects the peripheral circuit PC1 in the etching process of the stacked body 200.

Figure 3D:
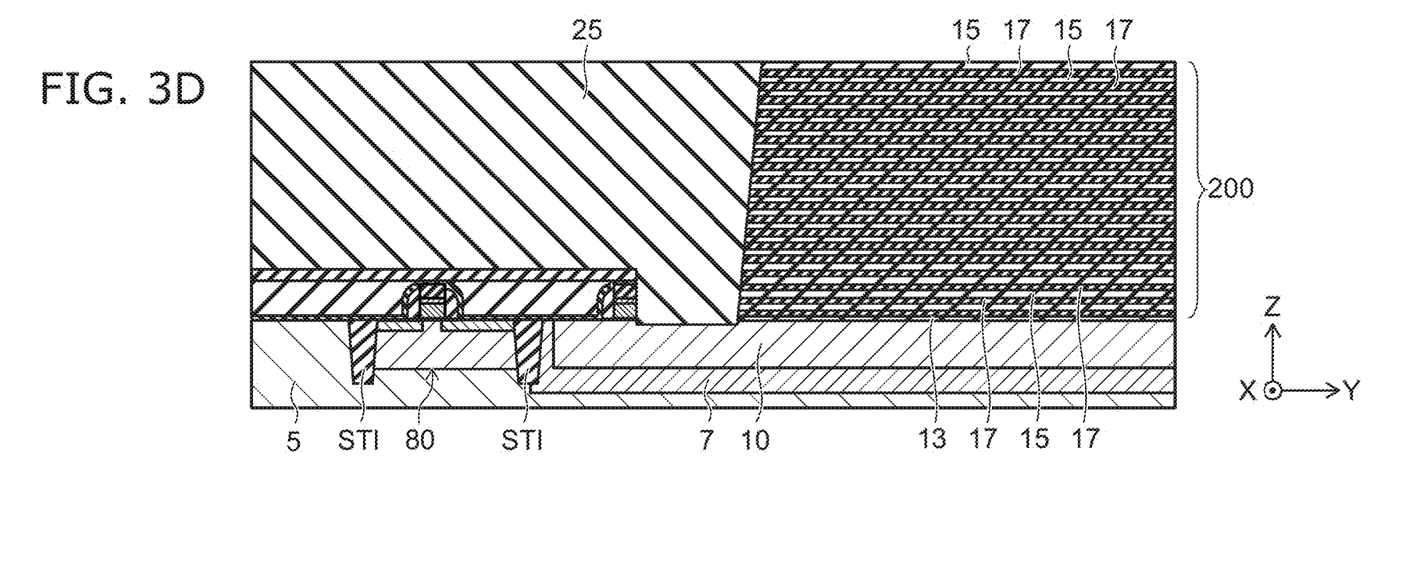

As shown in FIG. 3D, an insulating layer 25 is formed to cover the peripheral circuit PC1 and to planarize the step between the substrate 5 and the stacked body 200. For example, after forming the insulating layer 25 covering the stacked body 200 and the peripheral circuit PC1, the surface of the insulating layer 25 is planarized by CMP (Chemical Mechanical Polish). The top surface of the insulating layer 25 is positioned at the same level as the top surface of the stacked body 200, for example.

Figure 3E:
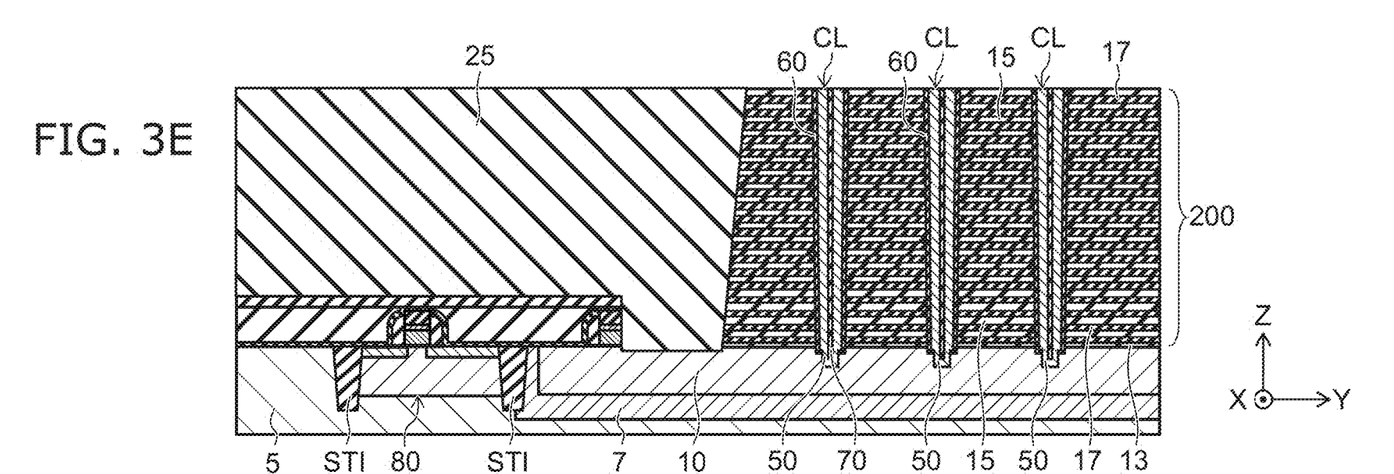

As shown in FIG. 3E, columnar bodies CL are formed in the stacked body 200. The columnar bodies CL are formed, for example, in the memory holes having a depth from the top surface of the stacked body 200 to the source layer 10.

Figure 3F:
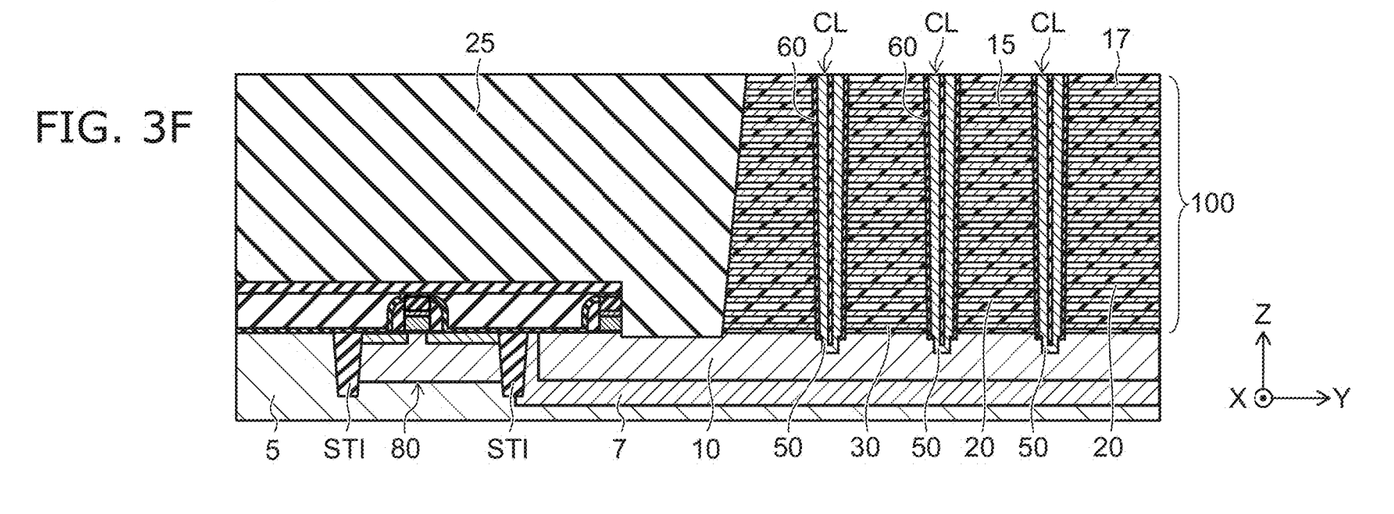

As shown in FIG. 3F, word lines 20, select gates 30 and 40 are formed by replacing the insulating layers 17 with metal layers. The insulating layers 17 are selectively removed, for example, via the slit spaces SL (see FIG. 1). Then, in spaces formed by removing the insulating layers 17, the metal layers are deposited, for example, using CVD. Thereby, the stacked body 100 can be completed.

Figure 4A:
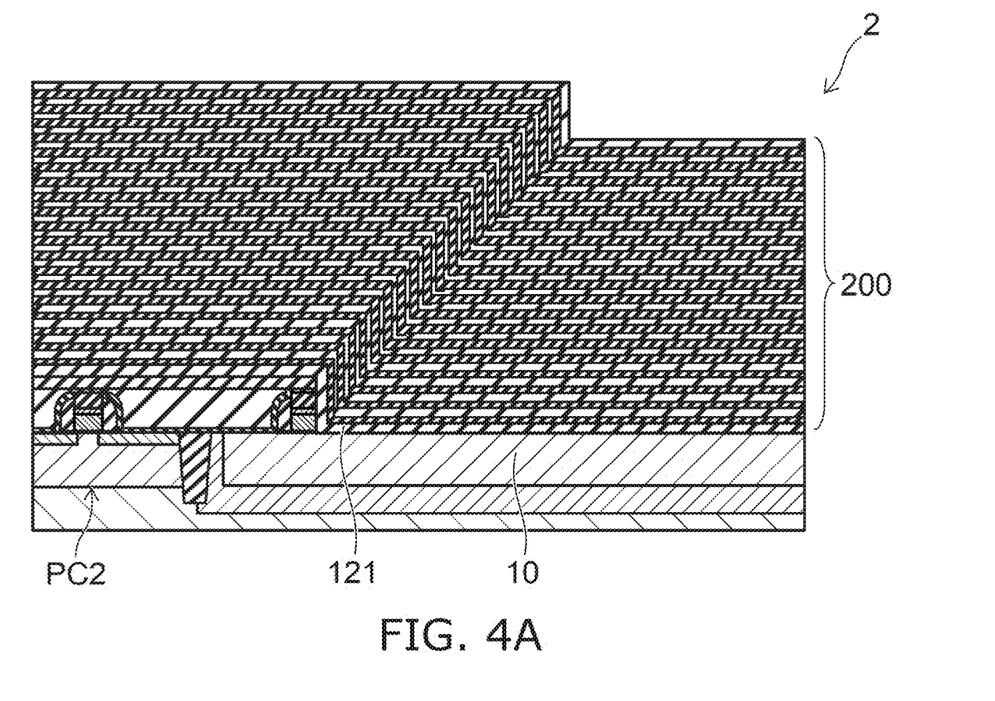
FIGS. 4A and 4B are schematic views showing a semiconductor memory device and characteristics thereof according to a first comparative example.
Figure 4B:
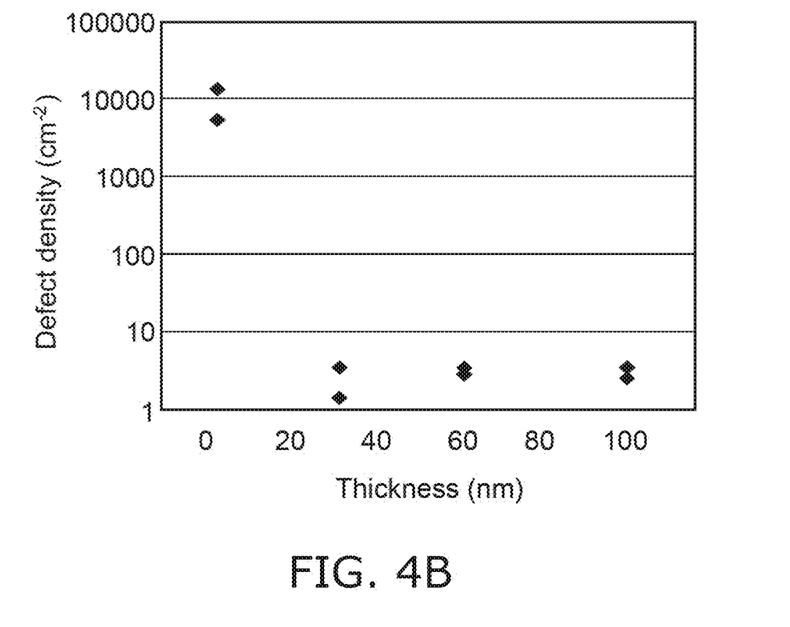

FIGS. 4A and 4B are schematic views showing a semiconductor memory device 2 and characteristics thereof according to a first comparative example. FIG. 4A is a schematic view showing a partial cross section of the semiconductor memory device 2. FIG. 4B is a graph showing defect densities in a peripheral circuit.

Figure 6:
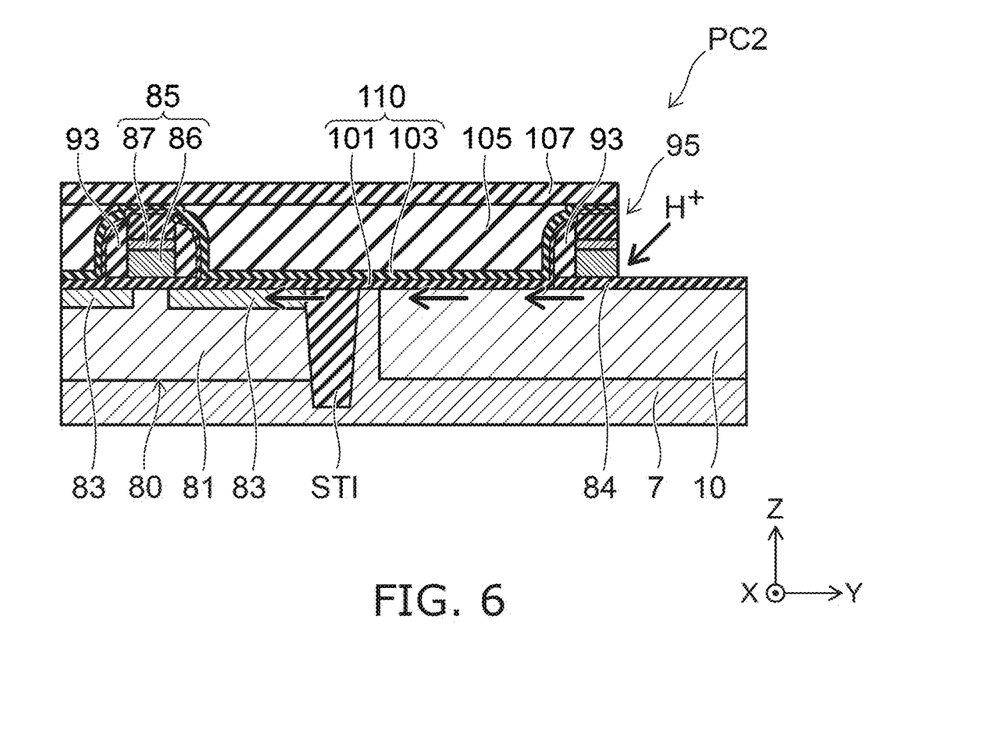
FIG. 6 is a schematic cross-sectional view showing a peripheral circuit of the semiconductor memory device according to the first comparative example and the second comparative example.

As shown in FIG. 4A, the semiconductor memory device 2 includes a peripheral circuit PC 2 (see FIG. 6). The stacked body 200 is formed so as to cover the source layer 10 and the peripheral circuit PC2. In this example, a barrier layer 121 is provided between the stacked body 200 and the source layer 10 and between the stacked body 200 and the source layer 10. The barrier layer 121 is, for example, a silicon nitride layer formed by thermal CVD.

The barrier layer 121 suppresses penetration of hydrogen radicals H+ into the peripheral circuit PC2, which are generated during the formation of the stacked body 200 using PCVD, for example. The hydrogen radical H+, for example, inactivates boron (B) which is a P-type impurity and lowers a carrier concentration in a P-type region. Further, in the gate electrode 85 of the transistor 80, nitrogen is bonded to the hydrogen radical H+ in the barrier region between the polycrystalline silicon layer 86 and the tungsten layer 87, thereby deteriorating the barrier property. Thus, the gate leakage current may increase.

FIG. 4B is a graph showing the correlation between the thickness of the barrier layer 121 and the defect density of the peripheral circuit PC2. Here, the defect density is, for example, the areal density of transistors which caused a malfunction. In FIG. 4B, shown are the case where the barrier layer 121 is not provided, i.e. the layer thickness of the barrier layer 121 is "0" nanometer (nm), and the case where the layer thickness is 30 nm, 60 nm and 100 nm.

As shown in FIG. 4B, when the barrier layer 121 is not provided, defects with a density of about 10000 $cm^{-2}$ are generated in the peripheral circuit PC2. In contrast, it is found that the defect density can be suppressed to 10 $cm^{-2}$ or less by providing the barrier layer 121 having a layer thickness of 30 nm or more.

Figure 5A:
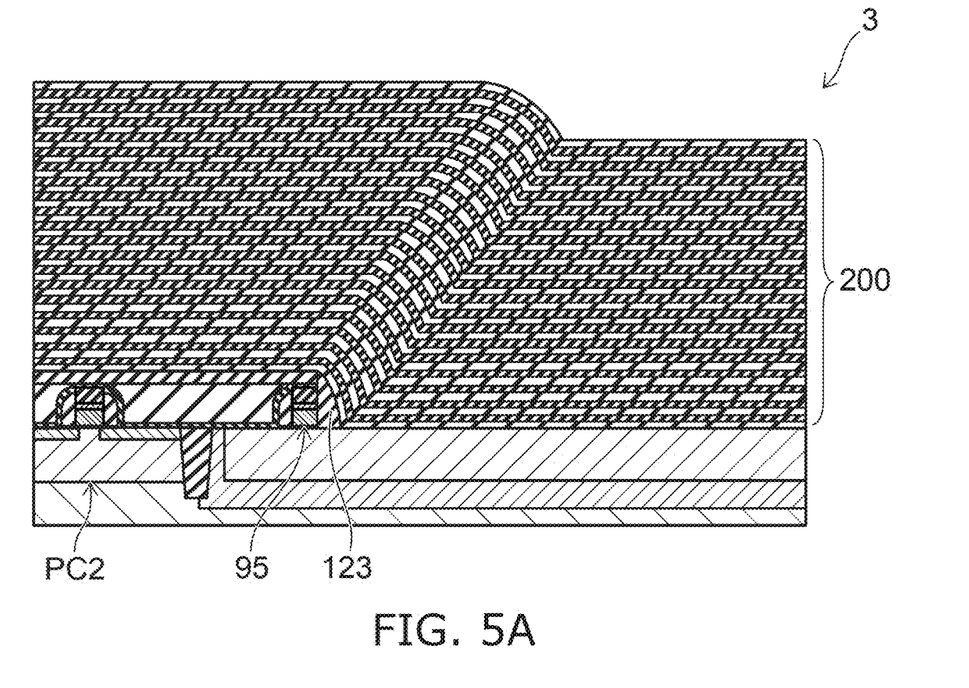
FIGS. 5A and 5B are schematic views showing a semiconductor memory device and characteristics thereof according to a second comparative example.
Figure 5B:
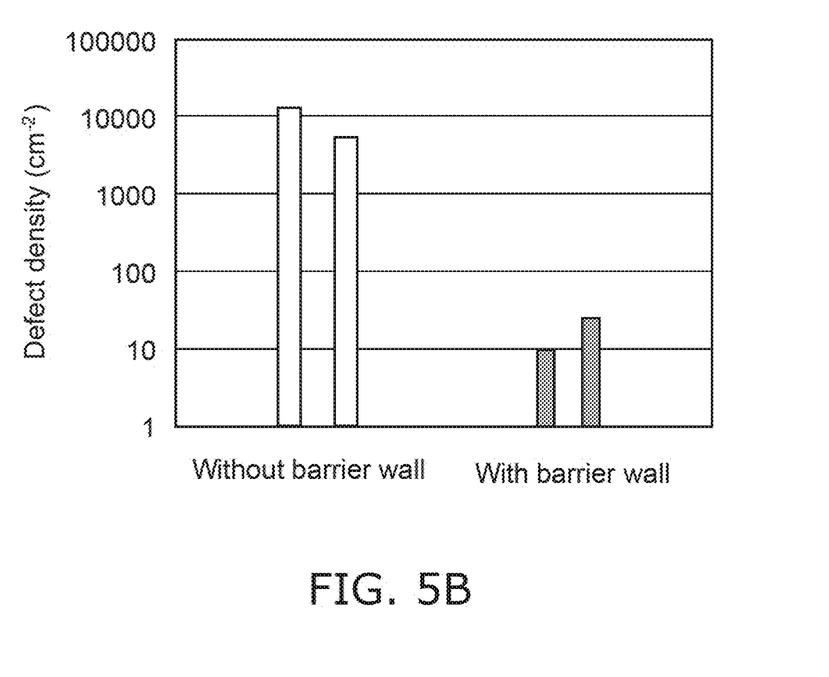

FIGS. 5A and 5B are schematic views showing a semiconductor memory device 3 and characteristics thereof according to a second comparative example. FIG. 5A is a schematic view showing a partial cross section of the semiconductor memory device 3. FIG. 5B is a graph showing a defect density in a peripheral circuit PC2.

As shown in FIG. 5A, the stacked body 200 is formed so as to cover the source layer 10 and the peripheral circuit PC2. In this example, a barrier wall 123 is provided on the side surface of the dummy gate 95. The barrier wall 123 includes, for example, silicon nitride formed by thermal CVD.

As shown in FIG. 5B, when the barrier wall 123 is not provided, defects of about 10000 $cm^{-2}$ are generated in the peripheral circuit PC2. In contrast, it is found that the defect density can be suppressed to about 10 $cm^{-2}$ by providing the barrier wall 123.

Thus, the characteristics shown in FIGS. 4B and 5B indicate that the penetration of the hydrogen radical H+ into the peripheral circuit can be suppressed by the silicon nitride layer. For example, silicon nitride blocks the diffusion of hydrogen radical H+ with a higher rate than silicon oxide.

FIG. 6 is a schematic cross-sectional view showing the peripheral circuit PC2 according to the first comparative example and the second comparative example. As shown in FIG. 6, in the peripheral circuit PC2, the first insulating layer 101 of the liner layer 110 is not divided between the gate electrode 85 of the transistor 80 and the dummy gate 95. Accordingly, the peripheral circuit PC2 has a structure in which the outside of the peripheral circuit region and the transistor 80 are linked by the silicon oxide layer.

In the peripheral circuit PC2 shown in FIG. 6, the second insulating layer 103 of the liner layer 110 and the insulating layer 107 are silicon nitride layers and have a structure capable of suppressing penetration of hydrogen radicals H+ from above. However, the outside of the peripheral circuit region and the transistor 80 are linked by the gate insulating layer 84, which is a silicon oxide layer, and the first insulating layer 101. That is, the peripheral circuit PC2 has a structure that cannot block the hydrogen radicals H+ that penetrate through silicon oxide.

In contrast, in the peripheral circuit PC1 shown in FIG. 2B, the first insulating layer 101 is divided into the first portion 101a and the second portion 101b, and the second insulating layer 103, which is in contact with the source layer 10, is interposed. Thereby, it is possible to block the penetration of hydrogen radicals H+ through the silicon oxide layer, and to improve the manufacturing yield of the semiconductor memory device 1 by reducing the defect density in the peripheral circuit PC1.

FIGS. 7A to 7E are schematic views illustrating exemplary layouts of the semiconductor memory device 1 according to the embodiment. In each view, shown is a chip surface of the semiconductor memory device 1. Hereinafter, an example is shown, in which two memory planes MPL are disposed, but the embodiment is not limited thereto. The semiconductor memory device 1 has at least one memory plane MPL and a peripheral circuit area PCA provided around the memory plane MPL. A broken line shown in each drawing represents a boundary between a chip surface and a dicing region.

Figure 7A:
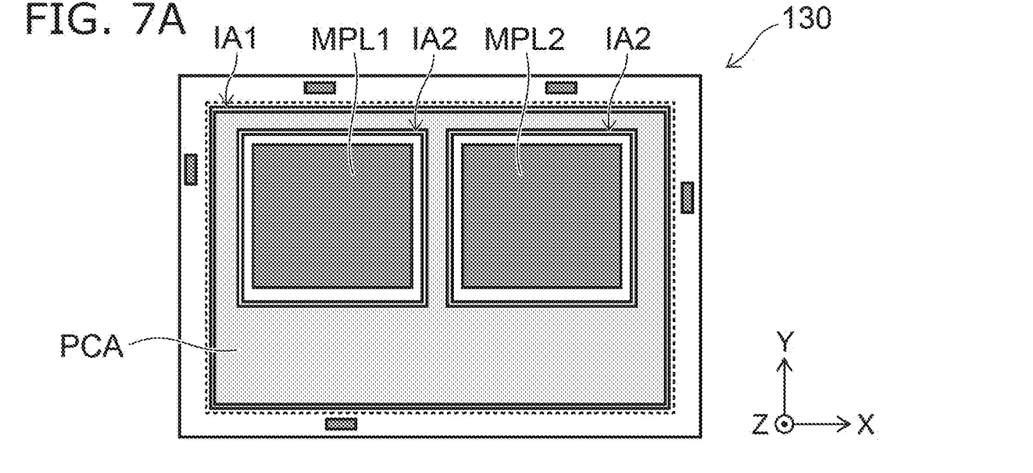

In a layout 130 shown in FIG. 7A, two memory planes MPL1 and MPL2 are arranged on the chip surface. The peripheral circuit area PCA is provided in the chip plane. As shown in FIG. 7A, an isolation region IA1 for blocking the penetration of hydrogen radicals H+ is provided along an outer edge of the peripheral circuit area PCA. Further, another isolation region IA2 is provided so as to surround each of the memory planes MPL1 and MPL2 disposed in the peripheral circuit area PCA. The isolation regions IA1 and IA2 are ones spacing the first insulating layer 101 of the liner layer 110, for example, a region between the first portion 101a and the second portion 101b (see FIG. 2B).

Figure 7B:
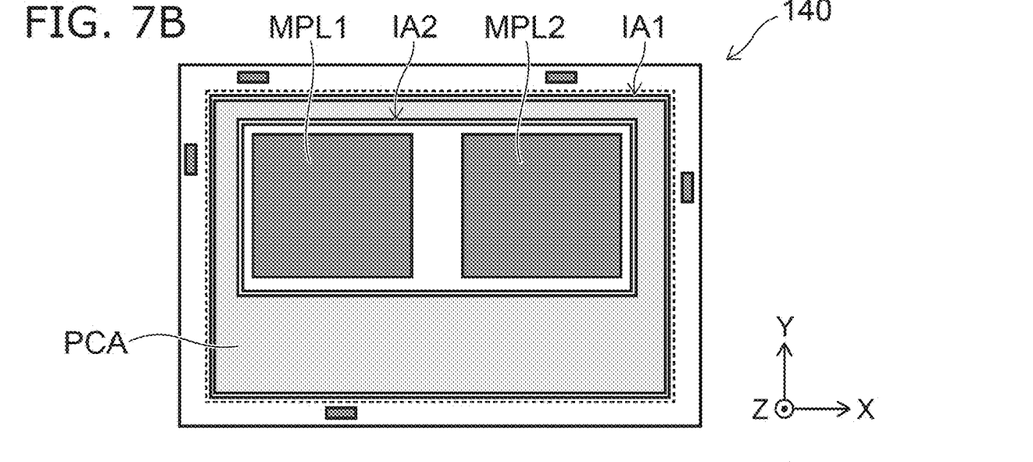

As in a layout 140 shown in FIG. 7B, when no peripheral circuit is disposed between the memory planes MPL1 and MPL2, the isolation region IA2 is provided so as to surround both the memory planes MPL1 and MPL2.

Figure 7C:
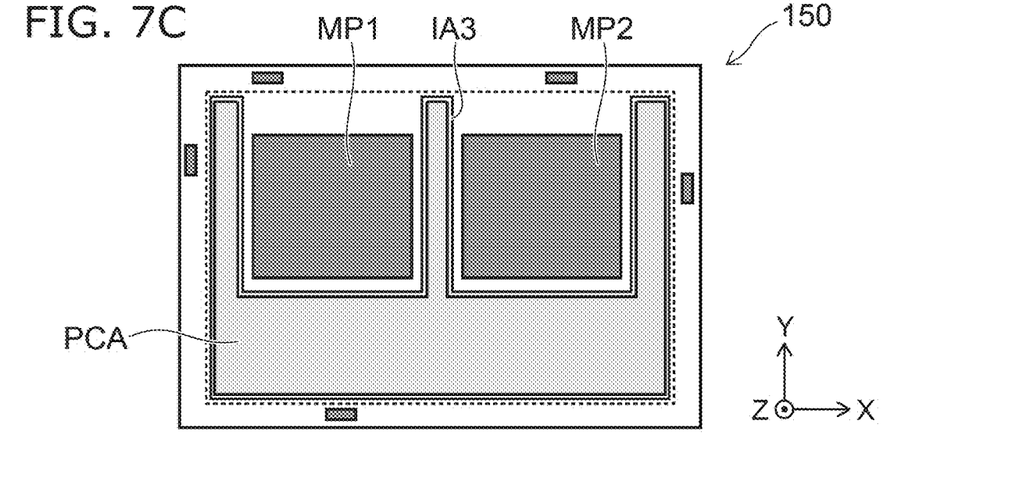

In a layout 150 shown in FIG. 7C, the peripheral circuit area PCA is provided so as to surround each three sides of the memory planes MPL1 and MPL2. An isolation region IA3 is provided along the outer edge of the peripheral circuit area PCA.

Figure 7D:
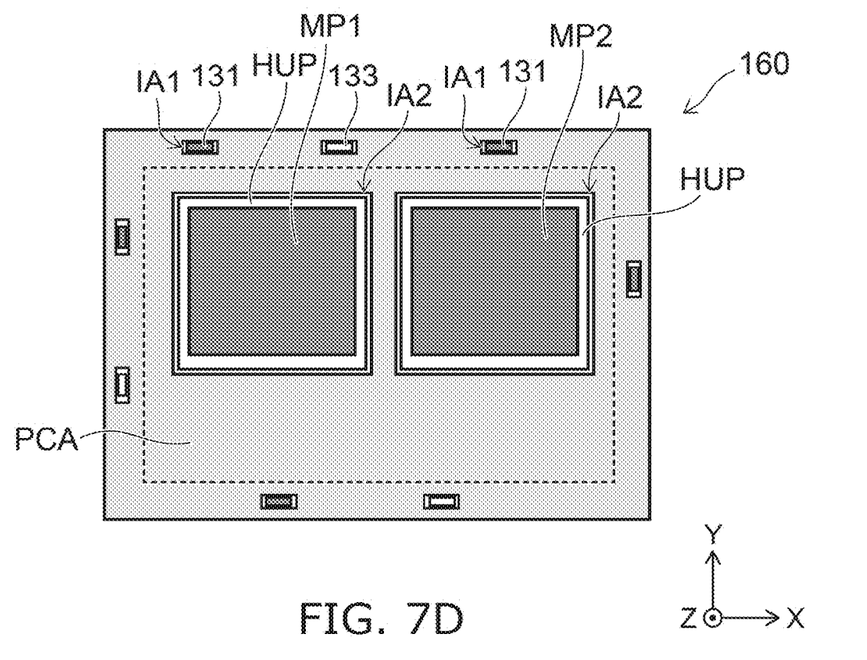

In a layout 160 shown in FIG. 7D, an isolation region IA2 surrounding each of the memory planes MPL1 and MPL2 is provided. The peripheral circuit area PCA is the entire chip surface except the memory planes MPL1 and MPL2 and the area HUP surrounding each thereof. In this example, no isolation region IA1 along the outer edge of the peripheral circuit area PCA is provided. In the dicing region, an isolation region IA4 is also provided around a region 131 where a part of the stacked body 200 remains and a region 133 which is not covered with the silicon nitride layer. In addition, in the area HUP, for example, a hook-up structure is provided for electrically connecting the word lines 20 and the selection gates 30 and 40 to the upper layer wirings.

Figure 7E:
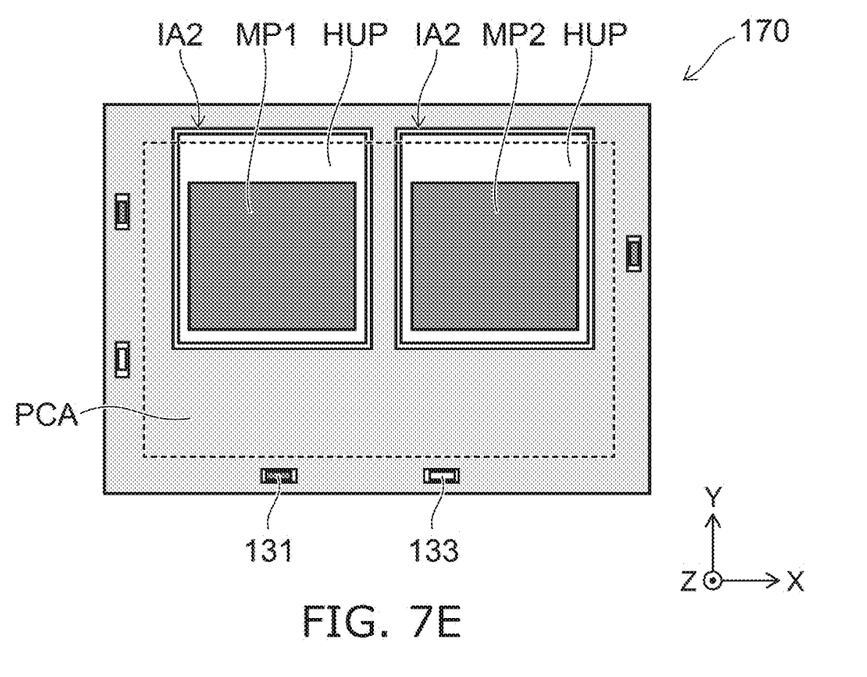

In a layout 170 shown in FIG. 7E, areas HUP surrounding the respective memory planes MPL1 and MPL2 extend to the dicing region. The peripheral circuit area PCA is the entire chip surface except the memory planes MPL1 and MPL2 and the areas HUP surrounding them respectively. An isolation region IA2 surrounding each of the memory planes MPL1 and MPL2 is provided along an outer edge of the area HUP, and a part thereof is positioned in the dicing region.

Although several embodiments have been described above, the embodiments are not limited thereto. For example, another material blocking the diffusion of hydrogen radicals H+ with high rate may be used in place of silicon nitride.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a substrate;
   a memory cell array on the substrate, the memory cell array including a plurality of electrode layers and a semiconductor layer, the plurality of electrode layers being stacked on the substrate, the semiconductor layer extending in the plurality of electrode layers along a stacking direction of the plurality of electrode layers, wherein a memory portion is provided between the semiconductor layer and one of the plurality of electrode layers;
   a transistor provided on the substrate, the transistor being placed away from the memory cell array, the transistor including a gate electrode and a gate insulating layer, the gate insulating layer being positioned between the gate electrode and the substrate;
   a first insulating layer on the substrate, the first insulating layer being placed between the memory cell array and the transistor, the first insulating layer being separated into first and second parts arranged along a surface of the substrate, the surface of the substrate including a first area between the first and second parts,
   a second insulating layer in contact with the substrate at the first area, the first part of the first insulating layer being placed between the first area and the memory cell array, the second part of the first insulating layer being placed between the first area and the transistor.

2. The device according to claim 1, wherein the first insulating layer includes silicon oxide.

3. The device according to claim 1, wherein the second insulating layer includes silicon nitride.

4. The device according to claim 1, wherein the second insulating layer covers the transistor.

5. The device according to claim 1, wherein the first area surrounds the memory cell array.

6. The device according to claim 1, wherein the substrate is a semiconductor substrate including a first well of a first conductivity type and a second well of the first conductivity type, the memory cell array being provided on the first well, the transistor being provided on the second well; and the second insulating layer is in contact with the first well.

7. The device according to claim 1, wherein the substrate includes a shallow-trench-isolation part provided between the memory cell array and the transistor; and the first area is provided between the memory cell array and the shallow-trench-isolation part.

8. A semiconductor memory device comprising:
   a substrate;
   a memory cell array on the substrate, the memory cell array including a plurality of electrode layers and a semiconductor layer, the plurality of electrode layers being stacked on the substrate, the semiconductor layer extending in the plurality of electrode layers along a stacking direction of the plurality of electrode layers, wherein a memory portion is provided between the semiconductor layer and one of the plurality of electrode layers;
   a first electrode above the substrate, the first electrode being positioned away from the memory cell array, the first electrode and the memory cell array being arranged along a surface of the substrate,
   a first insulating layer between the first electrode and the substrate;
   a second electrode above the substrate, the second electrode being placed between the memory cell array and the first electrode, the first and second electrodes being arranged in a second direction along the surface of the substrate;
   a second insulating layer between the second electrode and the substrate;
   a third insulating layer placed between the first insulating layer and the second insulating layer, the third insulating layer including first to third portions arranged in the second direction, the second portion being placed between the first portion and the third portion, the second portion being in contact with the substrate,
   a fourth insulating layer on the substrate, the first and third portions of the third insulating layer being placed above the substrate with the fourth insulating layer interposed.

9. The device according to claim 8, wherein the third insulating layer includes silicon nitride.

10. The device according to claim 8, wherein the fourth insulating layer includes silicon oxide.

11. The device according to claim 8, wherein the third insulating layer covers the first electrode and the second electrode.

12. The device according to claim 8, wherein a transistor and a dummy element are provided on the substrate, the transistor including the first electrode and the first insulating layer, the dummy element including the second electrode and the second insulating layer.

13. The device according to claim 8, further comprising:
first to third side walls above the substrate, the first to third side walls being arranged in the second direction, the first and second side walls being provided on both side surfaces of the first electrode, the third side wall being provided on one side surface of the second electrode opposite to the memory cell array, no side wall being provided on the other side surface of the second electrode.

14. The device according to claim 8, wherein the third insulating layer contacts the substrate at an area surrounding the memory cell array.

15. The device according to claim 8, wherein the third insulating layer contacts the substrate at an area closer to the second electrode than the first electrode.

16. The device according to claim 8, wherein the substrate is a semiconductor substrate including a first well of a first conductivity type and a second well of the first conductivity type, the memory cell array and the second electrode being provided above the first well, the first electrode being provided above the second well; and the third insulating layer is in contact with the first well.

17. The device according to claim 16, wherein the substrate further includes a shallow-trench-isolation part provided between the first and second wells; and the fourth insulating layer includes a portion in contact with the shallow-trench-isolation part.

* * * * *